Nov. 12, 1968 J. K. MANN 3,411,028

CAVITY RESONATOR TUNER FOR VELOCITY MODULATION TUBES

Filed Oct. 7, 1965 2 Sheets-Sheet 1

INVENTOR.
JOSEPH K. MANN
BY Harry E. Aine
ATTORNEY

INVENTOR.
JOSEPH K. MANN
BY Harry E. Aine
ATTORNEY

United States Patent Office
3,411,028
Patented Nov. 12, 1968

3,411,028
CAVITY RESONATOR TUNER FOR VELOCITY MODULATION TUBES

Joseph K. Mann, Palo Alto, Calif., assignor to Varian Associates, Palo Alto, Calif., a corporation of California
Filed Oct. 7, 1965, Ser. No. 493,860
7 Claims. (Cl. 315—5.48)

ABSTRACT OF THE DISCLOSURE

A multicavity klystron amplifier is disclosed. The amplifier tube includes a plurality of tunable re-entrant cavity resonators successively arranged along the beam path for electromagnetic interaction with the beam to produce an amplified output. The tube is tunable over a band of frequencies by means of capacitive tuning elements disposed within the cavity resonators for changing the gap capacity of the resonator. The tuning elements include a generally U-shaped conductive rod projecting into the cavity resonator and extending around the interaction gap. The U-shaped rod structure is movable transversely of the axis of the tube such that the bridging conductive portion of the U-shaped member, which interconnects the two leg portions of the U-shaped rod structure, varies the gap capacity of the cavity resonators for tuning their resonant frequencies. In a preferred embodiment, the conductive tuning rod is fixed to an inductive tuning diaphragm to be movable therewith such that a combined inductive and capacitive tuning effect is obtained. In another embodiment, the U-shaped conductive rod structure is made hollow to permit the flow of a coolant through the U-shaped tuning rod.

Figure 1:
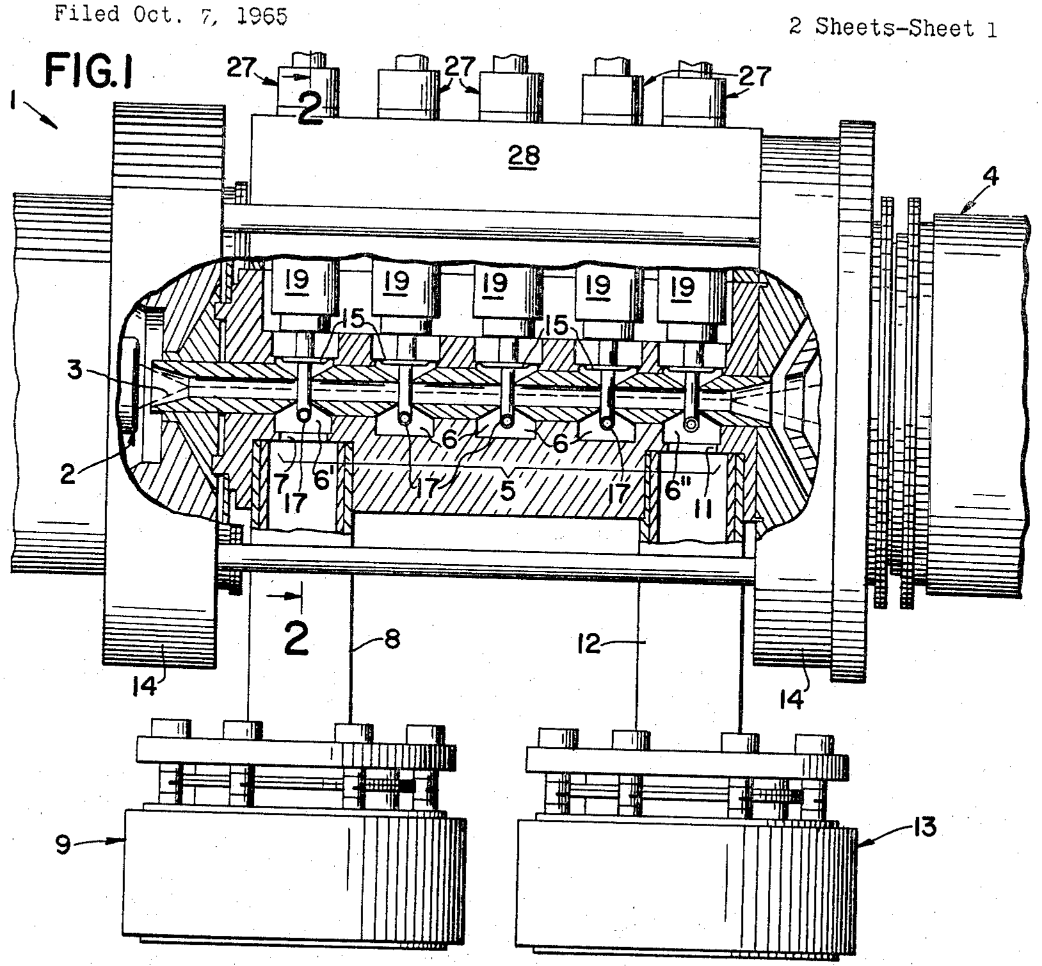

Heretofore, capacitive or combined inductive-capacitive (L–C) tuners have been employed for tuning the gap capacitance of re-entrant cavity resonators in velocity modulation microwave tubes. Typical prior L–C tuners are exemplified by the tuners shown in U.S. Patents Nos. 2,994,009 and 3,058,026 wherein a capacitor plate is carried from a movable inductive tuning wall member via the intermediary of a conductive support arm. The capacitive plate bridges across the gap of a re-entrant cavity resonator on the remote side of the gap from the movable inductive wall so that movement of the inductive wall produces a simultaneous additive change in both the inductance and capacitance of the cavity. In this manner relatively large changes in the resonant frequency of the cavity are obtained with small physical movements of the inductive wall and dependent capacitive plate.

Such prior art tuners are generally quite satisfactory for cavity resonators tuned to frequencies below three gigacycles because the tuning elements at these lower frequencies may have reasonably large physical dimensions to facilitate cooling as by conduction of thermal energy to a suitable heat sink or by providing fluid coolant passages in the tuning elements themselves. However, at operating frequencies above three gigacycles, the physical dimensions become relatively small and as the operating frequency increases it becomes more difficult to provide means for cooling the capacitive tuning element.

In the present invention, the capacitive tuning element of the cavity tuner, which bridges across the gap of the re-entrant cavity, is formed by a conductive rod formed in a generally U-shape. In a preferred embodiment the two leg portions of the U-shaped member are affixed to a movable inductive wall tuning diaphragm whereby an L–C tuner is obtained. In still another embodiment the U-shaped rod includes a coolant fluid passageway therethrough to facilitate cooling thereof in use.

The advantages of the U-shaped tuner rod of the present invention over the prior art include: ease of fabrication because of its simple shape; ease of fluid cooling because fluid can flow in one leg and out the other; improved spurious mode free operation because the U-shaped conductor inside the cavity will support fewer modes of oscillation than a pair of prior art capacitive tuning members; and improved thermal stability of the tuning characteristics because the symmetrical two leg support of the capacitive tuning member prevents mechanical leverage type amplification of thermally produced canting and warping distortions of the tuning member as encountered in the prior art.

The principal object of the present invention is to provide an improved cavity tuner for velocity modulation microwave tubes.

One feature of the present invention is the provision of a U-shaped conductive rod forming the capacitive tuning element bridging across the gap of a re-entrant cavity resonator whereby fabrication is facilitated and electrical performance of the tube using same is improved.

Another feature of the present invention is the same as the preceding wherein the rod is hollow providing a fluid coolant passageway to facilitate cooling of the tuning element in use.

Another feature of the present invention is the same as any one of the preceding features wherein the two legs of the U-shaped member are connected to and carried from a movable vacuum tight inductive tuning wall diaphragm to provide an L–C tuner.

Figures 2, 3:
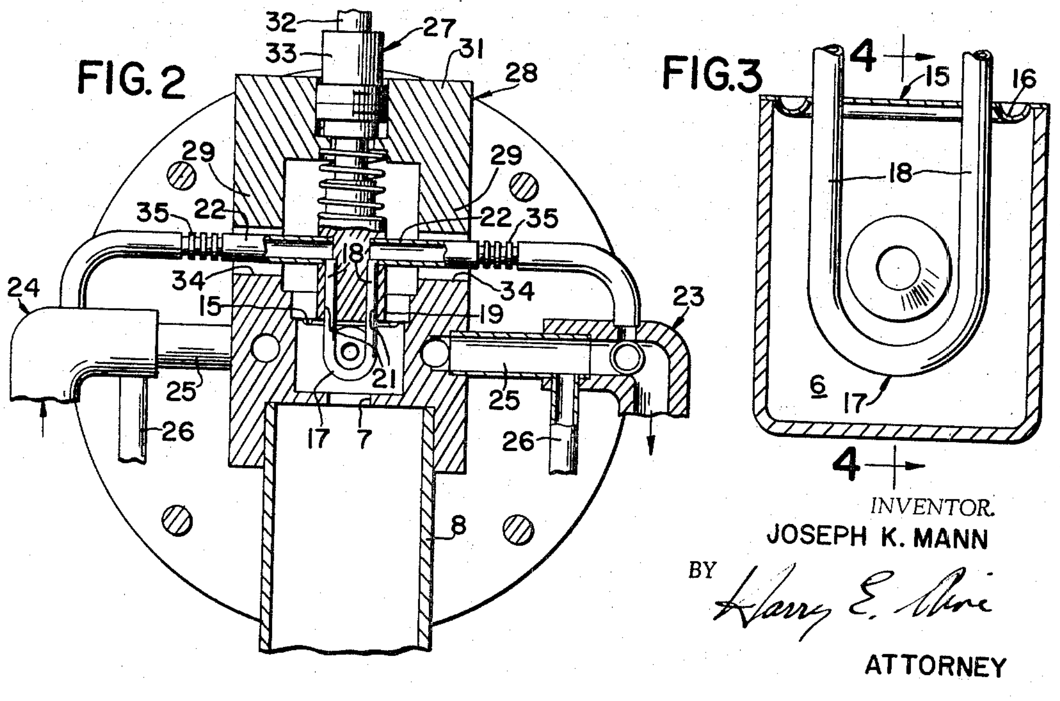
Figures 4, 5, 6:
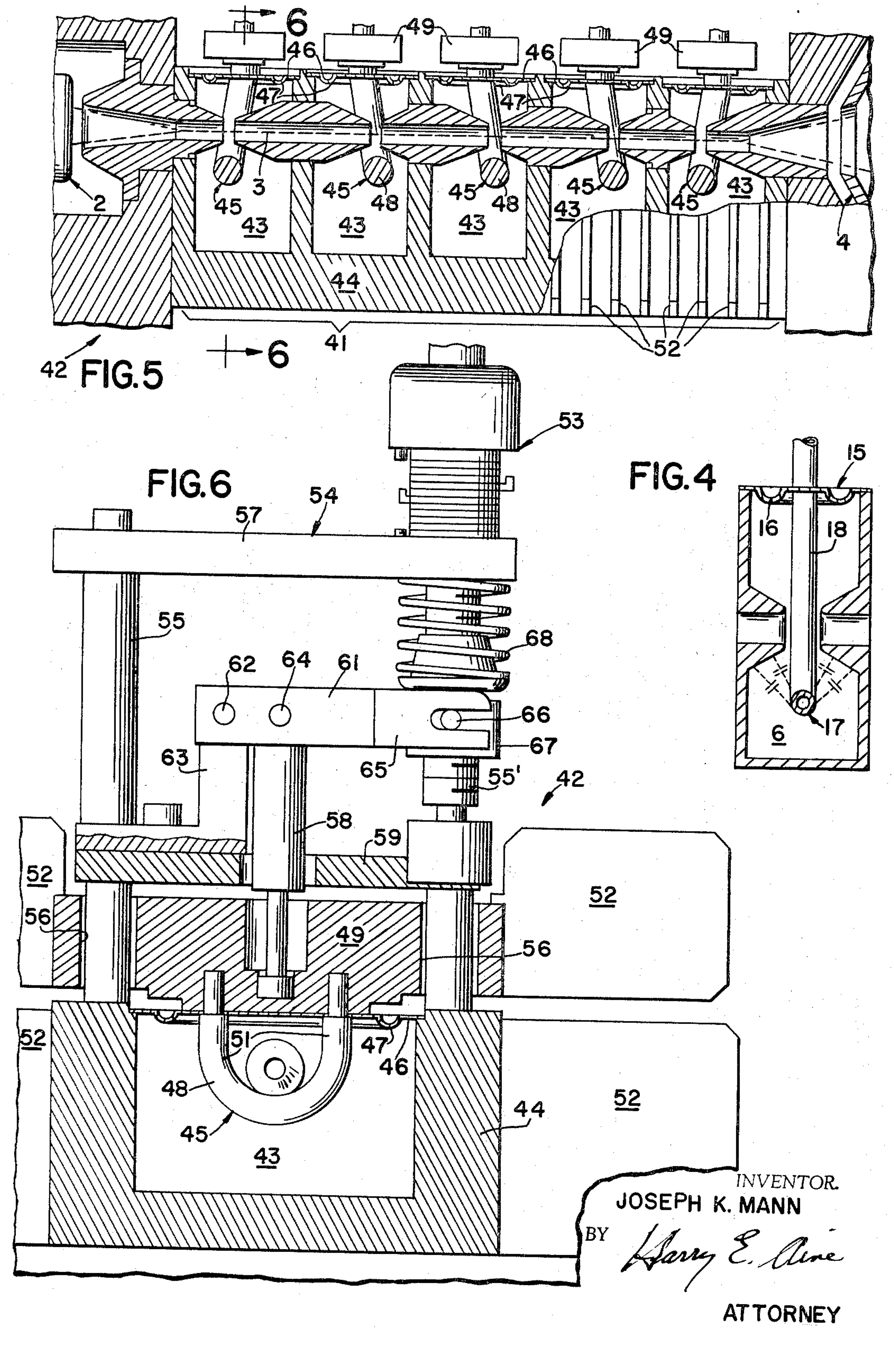

Other features and advantages of the present invention will become apparent upon a perusal of the following specification taken in connection with the accompanying drawings wherein:

FIG. 1 is a fragmentary longitudinal view partly in section showing a microwave tube employing the improved cavity tuner of the present invention, FIG. 2 is a transverse sectional view of the structure of FIG. 1 taken along line 2—2 in the direction of the arrows, FIG. 3 is an enlarged transverse view of a cavity resonator employing the tuner of the present invention, FIG. 4 is a transverse sectional view of the structure of FIG. 3 taken along line 4—4 in the direction of the arrows, FIG. 5 is a fragmentary longitudinal sectional view of a tube employing an alternative tuner embodiment of the present invention, and FIG. 6 is a transverse sectional view of the structure of FIG. 5 taken along line 6—6 in the direction of the arrows.

Referring now to FIGS. 1–4, a tube employing the tuner of the present invention will be described. A water cooled X-band, 20 kw. average CW microwave amplifier tube 1 is partially shown in FIGS. 1 and 2. The tube 1 includes an electron gun assembly 2 for forming and projecting a beam of electrons 3 over an elongated beam path to a water cooled collector assembly 4, only partially shown, for dissipating the energy of the spent beam. An electromagnetic interaction circuit 5, comprising a plurality of cavity resonators 6, is disposed along the beam path intermediate the gun and collector assemblies 2 and 4, respectively, for electromagnetic interaction with the beam 3 passable therethrough in the conventional klystron mode of operation. The first cavity 6′ is excited with signal energy to be amplified, applied thereto from a source via input iris 7 and input waveguide 8. The waveguide 8 is vacuum sealed by means of an R.F. permeable gas tight window assembly 9.

Amplified R.F. signals are removed from the beam by the output cavity 6″ and transmitted to a suitable utilization device or load, not shown, via output iris 11 and output waveguide 12. The output waveguide is vacuum sealed by means of an R.F. permeable gas tight window assembly 13. A pair of apertured pole pieces 14 straddle the interaction circuit and are connected to a suitable magnet, not shown, for producing an axially directed beam forcus magnetic field along the beam path for confining the beam to a desired diameter throughout the interaction circuit 5.

The cavity resonators 6 are each tuned by means of a combined L–C tuner in each cavity 6. The L–C tuner comprises a movable inductive wall diaphragm 15 (see FIGS. 3 and 4 for enlarged views) vacuum sealed across one side wall of the generally rectangular re-entrant cavity resonators 6. The diaphragms 15 are made of relatively thin gauge ductile conductive material such as 0.005″ thick O.F.H.C. copper sheet provided with an oval shaped corrugation 16 to facilitate flexure thereof in use.

A capacitive tuning element 17 is carried from the diaphragm 15 and is movable therewith. The capacitive tuning element 17 comprises a conductive rod, as of copper, formed into a generally U-shape with the two leg portions 18 of the U being fixed to the diaphragm 15 for support of the tuning element 17. In a preferred embodiment the U-shaped tuning element 17 is made of hollow tubing to provide a passageway for liquid coolant, such as water, to flow therethrough for cooling in use.

A copper block 19 is brazed to the outside (external to the vacuum) central surface of the diaphragm (see FIG. 2) and provided with a pair of bores 21 which receive the tubular extensions of the leg portions 18 of the tuning element 17. A pair of coolant pipes 22 intersect the bores 21, the pipes being connected at their ends into an input coolant manifold 24 and an exhaust coolant manifold 23. Other coolant pipes 25 and 26 are also connected into the manifolds 23 and 24 for cooling the interaction circuit 5 of the tube 1 and the R.F. window assemblies 9 and 13, respectively.

A conventional bridge type crew tuner drive 27 is used to move the diaphragm 15 with the dependent U-shaped capacitive tuner within the cavity resonator 6 for tuning. Such a tuner drive mechanism is described in U.S. Patent No. 2,915,670 and U.S. application Ser. No. 148,520, filed Oct. 30, 1961, now issued as U.S. Patent No. 3,281,616. Briefly, the tuner drive 27 comprises an inverted U-shaped bridge member 28 as of Monel affixed at the extremities of its two leg portions 29 to a block like body portion of the interaction circuit 5. The cross member portion 31 of the bridge 28 is centrally bored to receive captured screw drive shaft 32 and lock nut 33. The tuner block, carried from the back of the diaphragm 15 is centrally bored and threaded to receive the threaded end of the drive shaft 32. A compression spring is positioned surrounding the drive shaft 32 between the cross member 31 of the bridge and the tuner block 19 to load the threads and prevent backlash.

The coolant pipes 22 pass through bores 34 in the leg portions 29 of the tuner bridge 28 and are provided with flexible corrugated wall portions at 35 to allow flexure of the pipes 22 with movement of the tuner block 19.

In operation, the tube 1 is tuned by turning of the tuner drive shaft 32 which causes the tuner diaphragm 15 to move to vary the volume of the cavity resonator and thus inductively tune the cavity in the sense that increasing the volume of the resonator 6 lowers the resonant frequency and decreasing the cavity volume increases the resonant frequency. The dependent motion of the capacitive tuning member 17 also tunes the cavity in an additive sense to the inductive tuning effect. More specifically, when the U-shaped member 17 extends around to the remote side of the cavity gap, inward motion of the capacitive element 17 causes the connecting portion of the U-shaped member to move away from the gap thereby reducing the capacity between the re-entrant portions and increasing the resonant frequency of the cavity 6. Conversely, outward movement of the diaphragm causes the connecting portion of the U-shaped rod 17 to move in closer to the gap thereby increasing the capacitance across the gap and lowering the resonant frequency of the cavity 6.

In a typical embodiment of the water cooled L–C tuner of the present invention, the diaphragm and dependent capacitive tuner member 17 had a total motion of 0.050″ to produce a total tuning variation of 500 mc. centered at 8150 mc. The hollow capacitive tuning rod 17 had an inside diameter of 0.060″ and an outside diameter of 0.091″ and was supplied with cooling water at 30–40 p.s.i. and was capable of operation, in the tube 1, up to 100 kw. cw average power without overheating.

Referring now to FIGS. 5 and 6 there is shown an alternative embodiment of the present invention wherein the tube employing the L–C tuner of the present invention is air cooled and the re-entrant cavity gaps are axially asymmetric. More specifically, an electromagnetic interaction circuit 41 of the klystron tube 42 comprises a plurality of re-entrant cavity resonators 43 formed in a block like copper body 44 and axially spaced apart along the beam path 3 for successive electromagnetic interaction with the beam as previously described with regard to FIGS. 1–4.

An L–C tuner assembly 45 is provided in each cavity 43 for tuning and comprises an oval diaphragm 46 vacuum sealed across one side of the cavity 43 forming a movable inductive wall of the cavity 43. An oval corrugation 47 is provided in the diaphragm to facilitate flexure in use.

The capacitive element of the L–C tuner 45 is formed by a generally U-shaped conductive rod 48 as of copper. A thermally conductive block 49 as of copper is brazed to the external surface of the diaphragm 46 and two leg portions 51 of the U-shaped rod 48 are brazed into the diaphragm 46 and block 49 to provide a good thermal path therebetween. A plurality of thermally conductive fins 52 as of copper are brazed to the tuner block 49 and block body portion 44, respectively, to facilitate air cooling of the tube 42.

A tuner drive mechanism 53 of the conventional pivoted lever type, exemplified by that shown and described in U.S. Patent Application Ser. No. 312,766, filed Sept. 30, 1963, now issued as U.S. Patent 3,327,159 and assigned to the same assignee as the present invention, moves the L–C tuner 45 within the cavity 43. Briefly, the tuner drive mechanism 53 includes a bridge assembly comprising an inverted U-shaped structure 54 formed by a pair of leg members 55 as of stainless steel connected to the body 44 and passing through bores 56 in the tuner block 49 and including a cross arm member 57 as of stainless steel interconnecting the two legs 55.

A tuner drive shaft 58 as of stainless steel is connected centrally of the tuner block 49 and passes outwardly of the tube 42 through an aperture in a cover plate 59 mounted across the legs 55 of the tuner bridge 54. A tuning lever bar 61 is pivoted at one end 62 from a support member 63 carried from the cover plate 59. The tuner lever is pivotably connected intermediate its length at 64 to the tuner drive shaft 58. The other end of the tuner lever includes a longitudinally slotted fork member 65 with the slots engaging a pin 66 carried from a traveling nut 67 threadably mating with a captured screw forming one leg 55′ of the tuner bridge 54. A compression spring 68 is positioned around the leg 55′ in between the cross arm member 56 and the tuning lever 61 for loading the threads to prevent backlash.

In operation, rotation of the captured screw 55′ produces movement of the lever bar 61 about the pivot 62 causing the L–C tuner 45 to move in and out, as desired, of the resonator 43 via the intermediary of the drive shaft 58 which interconnects the tuning lever 61 and the tuner block 49. As above described with regard to FIGS. 1–4, inward movement of the tuner 45 increases.

the resonant frequency of the cavity and outward movement decreases the resonant frequency of the cavity 43.

The generally U-shaped capacitive tuner rod is axially canted from the center plane of the cavity and from its point of support from the diaphragm 46. This canting permits the tuning rod 48 to be employed in a re-entrant cavity 43 having an axially asymmetric disposition of the interaction gap defined as the gap between the re-entrant drift tube members.

In a typical tube operating at a center frequency of 6000 mc., the L–C tuner of the present invention, as shown in FIGS. 5 and 6, had the following dimensions and operating characteristics: The tuner rod 48 was 0.137" in diameter, with the turn around portion of the U having a semicircular shape and a radius of curvature, to the center of the rod, of 0.278". The axial canted displacement, measured from the center of the rod 48, was 0.075". The diaphragm 46 was 0.005" thick O.F.H.C. copper sheet, 0.5" wide and 1.310" long. The cavity gap was 0.048" in axial length. The tube successfully operated at 2 kw. average CW power, air cooled; with the tuning rod 48 operating at about 200° C. in thermal equilibrium. The tube was tunable over a total tuning range of 500 mc. centered at 6,175 mc. by a total of 0.050" displacement of the tuning diaphragm 46.

The generally U-shaped capacitive tuning element 17 and 48 of the present invention has been described as it is employed in a preferred L–C type tuner. However, it may be employed to advantage as merely a capacitive tuning member in which case it need not pass around the re-entrant cavity gap. In addition, the capacitive tuning rod may have various shaped contortions superimposed upon its generally U-shape to obtain certain desired slopes for the tuning rate curve. Furthermore, additional capacity for the element may be obtained by appending various shaped capacitive members to the U-shaped rod member.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. A high frequency tube apparatus including, means for forming and projecting a beam of electrons over an elongated beam path, means at the terminal end of the beam path for collecting the beam and dissipating the spent energy thereof, means forming an interaction circuit disposed along said beam path intermediate said beam forming means and said collector means for electromagnetic interaction with said beam, said interaction circuit means including a re-entrant cavity resonator having axially re-entrant conductive portions defining an interaction gap therebetween, a tuning means for said resonator including a generally U-shaped conductive rod portion projecting into said cavity resonator in the region of R.F. electric field thereof, which field bridges across said interaction gap, and said U-shaped conductive rod being defined by a pair of generally parallel leg portions and a conductive rod portion disposed adjacent said intertion gap and interconnecting said leg portions for varying the gap capacity and thus tuning said resonator.

2. The apparatus according to claim 1 wherein said U-shaped rod extends around said interaction gap.

3. The apparatus according to claim 1 wherein said U-shaped rod is hollow to accommodate flow of a fluid coolant therethrough.

4. The apparatus according to claim 1 including means for moving said U-shaped member in a direction generally transverse to said interaction gap for varying the capacity of said resonator.

5. The apparatus according to claim 1 wherein said re-entrant gap is axially asymmetric in said resonator and said U-shaped tuning rod is axially canted of said resonator to be positioned in the immediate vicinity of said gap.

6. The apparatus according to claim 2 wherein said U-shaped rod includes a pair of leg portions fixedly connected to a movable side wall of said cavity resonator thereby forming a combined inductive and capacitive tuner for said cavity resonator.

7. The apparatus according to claim 6 wherein said movable side wall is formed by an oval diaphragm vacuum sealed at its edges to said cavity resonator.

References Cited

UNITED STATES PATENTS

| | | | |
|---|---|---|---|
| 2,994,009 | 7/1961 | Schmidt et al. | 315—5.48 |
| 3,240,984 | 3/1966 | Bieghler et al. | 315—5.48 |

HERMAN KARL SAALBACH, *Primary Examiner.*

S. CHATMON, Jr., *Assistant Examiner.*